United States Patent
Takeda et al.

[11] Patent Number: 5,892,271
[45] Date of Patent: Apr. 6, 1999

[54] SEMICONDUCTOR DEVICE

[75] Inventors: Hidetoshi Takeda; Manabu Bonkohara, both of Tokyo, Japan

[73] Assignee: NEC Corporation, Tokyo, Japan

[21] Appl. No.: 634,411

[22] Filed: Apr. 18, 1996

[30] Foreign Application Priority Data

Apr. 18, 1995 [JP] Japan ................................ 7-092155

[51] Int. Cl.⁶ .................................................. H01L 23/495
[52] U.S. Cl. ........................... 257/668; 257/778; 257/780
[58] Field of Search .................... 257/668, 782, 257/783, 784, 779, 780, 781, 737, 738, 701, 702, 778

[56] References Cited

U.S. PATENT DOCUMENTS

| | | | |
|---|---|---|---|
| 3,868,724 | 2/1975 | Perrino | 257/668 |
| 4,246,595 | 1/1981 | Noyori et al. | 257/668 |
| 4,721,995 | 1/1988 | Tanizawa | 257/668 |
| 4,783,695 | 11/1988 | Eichelberger et al. | 257/668 |
| 4,878,098 | 10/1989 | Saito et al. | 257/668 |
| 4,914,741 | 4/1990 | Brown et al. | 257/668 |
| 5,128,746 | 7/1992 | Pennisi et al. | 257/783 |
| 5,159,434 | 10/1992 | Kohno et al. | 257/784 |
| 5,214,307 | 5/1993 | Davis | 257/782 |
| 5,602,419 | 2/1997 | Takeda et al. | 257/668 |
| 5,659,952 | 8/1997 | Kovac et al. | 257/668 |
| 5,668,405 | 9/1997 | Yamashita | 257/668 |

FOREIGN PATENT DOCUMENTS

| | | |
|---|---|---|
| 4233749 | 3/1992 | Japan . |
| 5129366 | 5/1993 | Japan . |

*Primary Examiner*—Mahshid Saadat
*Assistant Examiner*—S. V. Clark
*Attorney, Agent, or Firm*—Sughrue, Mion, Zinn, Macpeak & Seas, PLLC

[57] ABSTRACT

A first bump is arranged on an electrode of a semiconductor chip. An opening portion formed at a position corresponding to an electrode on the semiconductor chip, a conductive lead subjected to patterning and arranged in the opening portion, and a second bump for being connected to the outside of the device are formed on a flexible substrate, and the conductive lead and the first bump are connected to each other in the opening portion. An external shape of the flexible substrate is approximately the same as that of the semiconductor chip.

12 Claims, 6 Drawing Sheets

SEMICONDUCTOR DEVICE

BACKGROUND OF THE INVENTION

1. Field of the Invention

The present invention relates to a semiconductor device, more particularly to a semiconductor device of the size of a semiconducter chip and which includes the; chip and a flexible substrate.

2. Description of the Related Art

First of all, a package known as uBGA ( Ball Grid Array) manufactured by Tessera Co., will be described below.

A semiconductor device called TCC ( Tessera-Compliant-Chip), which is published in "Nikkei Micro Device, page 98–102, May 1994, and is disclosed in U.S. Pat. No. 5,258,330, has a wiring structure very similar to that of a two-layer TCP (Tape Carrier Package). A flexible wiring substrate used for this package is manufactured in processes similar to those employed to make a TCP tape.

The conventional semiconductor device described above is shown in a sectional view in FIG. 1.

A flexible wiring substrate 32 has the same structure as the so-called two-layer TCP-composed Cu-polyimide using no adhesive agent, in which Au is sputtered and plated on the film 31 made of polyimide, and the wiring 33 and the lead 37 are formed by being patterned. Via-holes formed in the film 31 are filled with Ni-plating or solder. Further, Ni or the solder accumulates so that the semispherical bump 34 which is higher than the film 31 is formed. The surface of the bump 34 is coated with thin Au plating. The film 31 is fixed to the semiconductor chip 36 with the elastic adhesive agent 35. The film 31 serves also to seal the semiconductor chip 36. The lead 37 which extends from the film 31 attached to the semiconductor chip 36 is connected to the Al pad or Au pad on the semiconductor chip 36 by means of a thermo-compression bonder using jointly ultrasonic waves. Thus, the lead 37 is made to be gull-wing shaped. This semiconductor device attaches the protection frame 38 to the circumference of the semiconductor chip 36. The inside of the protection frame 38 is filled with resin so that the lead 37 is sealed.

This package has a feature in that it is excellent as KGD ( Known Good Die ) technology. Specifically, since the package is an area array package which is called a uBGA, the package can be subjected to a burn-in test after it is attached to the testing substrate for use in a PGA ( Pin Grid Array ). Thus, this test is carried out easily prior to mounting.

Next, TBGA ( Tape Ball Grid Array ) manufactured by IBM Co., disclosed in Published Unexamined Japanese Patent Application Heisei 1-307236, will be described with reference to FIG. 2, as a conventional semiconductor device.

It has been proved that the adoption of very thin flexible materials for the substrate carrier is effective for solving the problem of the thermal expansion difference between the semiconductor chip and the carrier. FIG. 2 is a sectional view of a semiconductor device whose structure is devised considering the above fact. In the semiconductor device of FIG. 2, the insulative material layer 22 made of a material such as teflon is molded on the metal carrier layer 21, and the via-hole 23 is formed in the insulative material layer 22. The metal film 24 is formed on the insulative material layer 22. Then, the necessary circuits are formed on the metalized insulative material layer 22 and the portion where the connection terminals for electronics devices and the like are bonded. In FIG. 2, the semiconductor chip 25 is connected to these circuits. The circuit patterns are formed also in the metal carrier layer 21, and the BGAs composed of the bumps 26 for connection to the mounting substrate are arranged on the metal carrier layer 21. These bumps 26 are formed by soldering or thermo-compression bonding. The semiconductor device in FIG. 2 has a structure that the carrier is composed of a flexible material. Therefore, the carrier has an effect on the connection to the mounting substrate affected by the thermal expansion difference.

In the first conventional semiconductor devise shown in FIG. 1 and described above, the elastic adhesive agent 35 has to be filled in between the flexible wiring substrate 32 and the semiconductor chip 36. In the second conventional semiconductor device shown in FIG. 2 and described above, a carrier which is far larger than the semiconductor chip 25 is used so that a large mounting area is needed.

Furthermore, in any of the semiconductor devices shown in FIGS. 1 and 2, a high positional precision is necessary for the connection between the semiconductor chip and the carrier and thus the positioning of both is difficult. The smaller the connection pitch of the connection portion of the semiconductor chip and the carrier is, the more severe the above problem is.

SUMMARY OF THE INVENTION

The object of the present invention is to provide a semiconductor device which requires no elastic adhesive agent and has a small mounting area.

Another object of the present invention is to provide a semiconductor device in which the connection between the semiconductor chip and the carrier is easily made.

Still another object of the present invention is to provide a semiconductor device which uses a flexible substrate capable of being subjected to tests such as a burn-in test, prior to mounting.

To achieve the above described objects, the semiconductor device of the present invention comprises:

a flexible substrate having substantially the same size as that of a semiconductor chip, and an opening portion formed at the position corresponding to an electrode on said semiconductor chip;

a conductive lead which is patterned on said flexible substrate, and is formed in said opening portion;

a first bump formed on an electrode on said semiconductor chip and being connected to said conductive lead; and a second bump formed on said flexible substrate and connected to said conductive lead, and said second bump being used for a connection to the outside.

Furthermore, the conductive lead is formed on the opposite surface of the flexible substrate to the semiconductor chip. The first bump may be set in the opening portion of the flexible substrate, or the first bump may be composed of a plurality of metal protrusions piled up. The first bump and the opening portion may be sealed with resin.

Furthermore, the semiconductor device of the present invention comprises:

a flexible substrate having the same external shape as that of a semiconductor chip, in which a through-hole is formed at the position corresponding to an electrode on the semiconductor chip;

a pad obtained by burying the through-hole with a conductive material;

a conductive lead formed on the flexible substrate by patterning and connected to the pad;

a first bump formed on an electrode of the semiconductor chip and connected to the pad; and a second bump for external connection formed on the flexible substrate and connected to the conductive lead.

These semiconductor devices can be obtained first by integrating an uncut flexible substrate which is larger than a semiconductor chip before cutting it, an uncut conductive lead formed on the uncut flexible substrate by patterning; and an electrode for testing formed in a region on the flexible substrate other than that on which the semiconductor chip is mounted and connected to the uncut conductive lead, and cutting the uncut flexible substance together with the uncut conductive lead along the external circumference of the semiconductor chip to remove the outside of the flexible substance and the conductive lead.

BRIEF DESCRIPTION OF THE DRAWINGS

The present invention is illustrated in the following drawings wherein.

DETAILED DESCRIPTION OF THE PREFERRED EMBODIMENTS

The embodiments of the present invention will be described with reference to the accompanying drawings.

(Embodiment I)

An embodiment I of the present invention will be described with reference to FIGS. 3 and 4.

Figure 1:
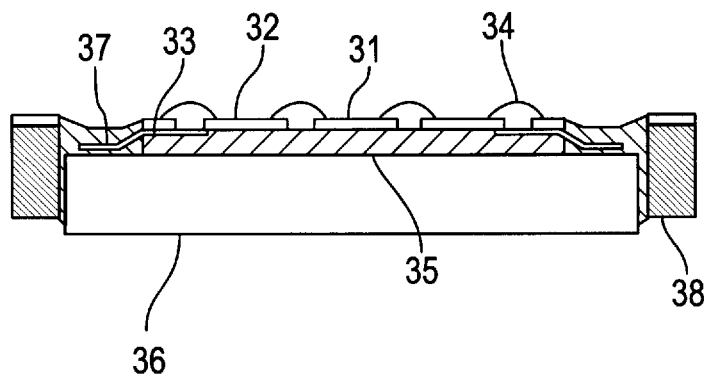
FIG. 1 is a sectional view showing a conventional semiconductor device.
Figure 2:
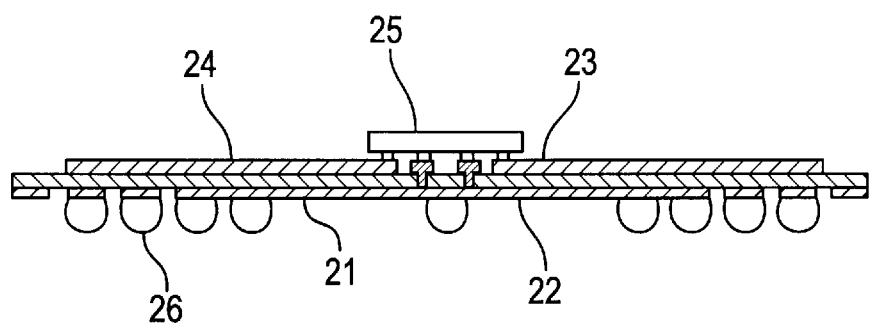
FIG. 2 is a sectional view showing another conventional semiconductor device.
Figure 3:
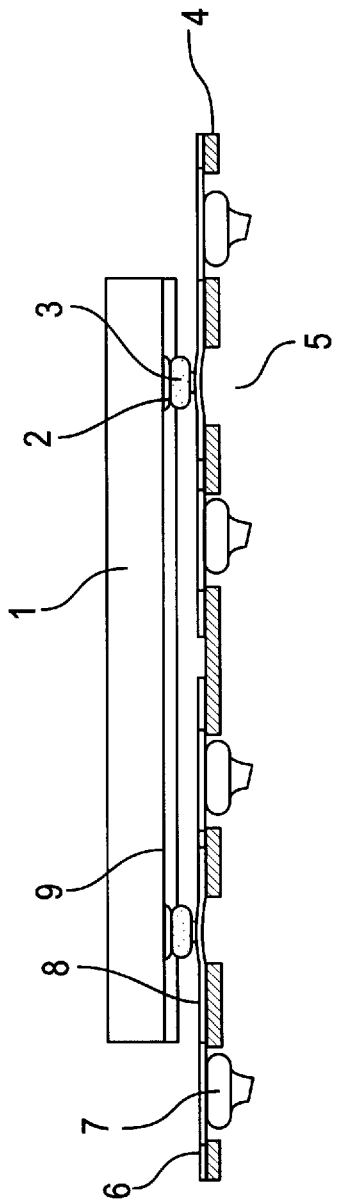
FIG. 3 is a sectional view showing a first embodiment of a semiconductor device of the present invention.
Figure 4:
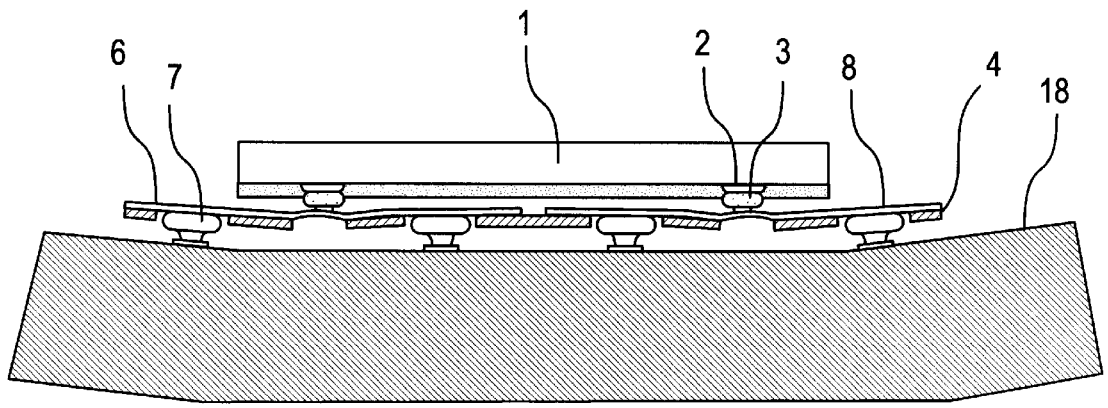
FIG. 4 is a sectional view showing the state in which the semiconductor device shown in FIG. 3 is mounted on a mother board.

In FIGS. 3 and 4, a plurality of electrodes 2 made of a material such as aluminium are formed in the peripheral portion of the electrode surface of a semiconductor chip 1. A plurality of metal projection bumps 3 made of a material such as gold, Au/Pd and copper are formed on the electrodes 2. Furthermore, a coating 9 made of epoxy or silicone series resin covers the electrode surface of the semiconductor chip 1 to protect the electrode surface of the semiconductor chip 1 from air and moisture. The metal projection bumps 3 projects from the resin coating 9.

On the other hand, a flexible substrate 4 is made of a material such as polyimide (PI) and epoxy series resin, and it comprises a plurality of opening portions 5 each of which is formed at the position corresponding to an electrode 2 of the semiconductor chip 1. A plurality of external connection electrodes 6 are formed on the flexible substrate 4. Metal projection bumps 7 are formed on the corresponding external connection electrodes 6. The external connection electrodes 6 and the metal protrusions 3 on the electrodes 2 of the semiconductor chip 1 are electrically connected to each other by conductive leads 8 formed on the flexible substrate 4. The conductive leads 8 are made of copper, aluminium, and gold and the like.

The conductive leads 8 are formed on the side of the flexible substrate 4 where the semiconductor chip 1 is mounted. Each of the metal projection bumps 3 on the electrodes 2 of the semiconductor chip 1 is bonded to the conductive lead 8 on the opening portion 5 of the flexible substrate 4, which correspond to the metal projection bump 3. Moreover, some of the external connection electrodes 6 are arranged in a single row or in a plurality of rows at the outer positions with respect to the positions at which the electrodes 2 are arranged. Other external connection electrodes 6 are arranged in a single row or in a plurality of rows at the inner positions with respect to the positions at which the electrodes 2 are arranged.

In this embodiment, the majority of the external connection electrodes 6 and the metal projection bumps 7 can be arranged in the region on the flexible substrate 4 corresponding to the semiconductor chip 1. Even when the external connection electrodes 6 and the metal projection bumps 7 are arranged outside of the region on the flexible substrate 4 corresponding to the semiconductor chip 1, the external connection electrodes 6 and the metal projection bumps 7 arranged outside of the region corresponding to the semiconductor chip 1 can be arranged in the small number of the rows, for example, one row or two rows, along the outer circumference of the semiconductor chip 1. As a result, it will suffice that the dimensions of the flexible substrate 4 are only slightly larger than those of the semiconductor chip 1 whereby the mounting area can be reduced.

FIG. 4 shows the semiconductor device of this embodiment of the present invention mounted on a mother board 18. The thickness of the flexible substrate 4 is about 100 µm, and a space of 40 to 50 µm width is provided between the flexible substrate 4 and the semiconductor chip 1. For this reason, even when the semiconductor device of this embodiment is mounted on the mother board 18 where a warp or a winding is produced, the flexible substrate 4 never deforms along the warp or the winding of the mother board 18, and the semiconductor chip 1 is not affected by deformation.

(Embodiment II)

Figure 5:
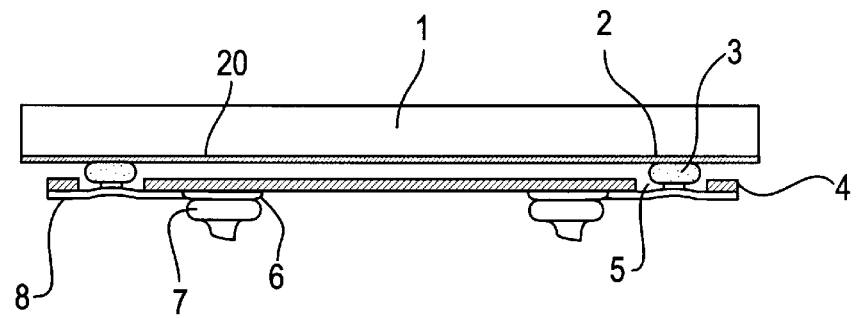
FIG. 5 is a sectional view showing a second embodiment of a semiconductor device of the present invention.

An embodiment II of the present invention will be described with reference to FIG. 5.

In the semiconductor device of the embodiment II, conductive leads 8 are formed on the opposite side of a flexible substrate 4 to that on which a semiconductor chip 1 is mounted. Furthermore, to protect it from air and moisture, a coating 20 made of, for example, polyimide (PI) is formed on the electrode surface of the semiconductor chip 1 on which the electrodes are to be formed. Metal projection bumps 3 made of gold, Au/Pd, copper and the like are formed on electrodes 2 of the semiconductor chip 1. Opening portions 5 are formed in the flexible substrate 4 at the positions corresponding to the respective metal projection bumps 3. The metal projection bumps 3 are set in the corresponding opening portions 5. Thus, the positioning of the semiconductor chip 1 with respect to the flexible substrate 4 is performed, and each of the metal projection bumps 3 of the semiconductor chip 1 is bonded to the corresponding conductive leads 8 at the opening portions 5.

In the embodiment II of the present invention, the electrodes 2 of the semiconductor chip 1 and the metal projection bumps 3 formed thereon used for positioning serve actually as signal and power-source lines. Therefore, it is required for the electrodes 2 and the metal projection bumps 3 to be put into contact with the conductive leads 8 located at the opening portions 5. FIG. 5 shows an example of the configuration structure that the electrodes 2 are arranged in the peripheral portion of the semiconductor chip 1 and the external connection electrodes 6 are arranged, in one row or a plurality of rows, at the inner positions than the peripheral portion in which the electrodes 2 are arranged. Thus, by arranging the external connection electrodes 6 as described above, the dimension of the flexible substrate 4 can be reduced so as to be smaller than that of the semiconductor chip 1. A small mounting area can be obtained.

(Embodiment III)

An embodiment III of the present invention will be described with reference to FIG. 6.

Figure 6:
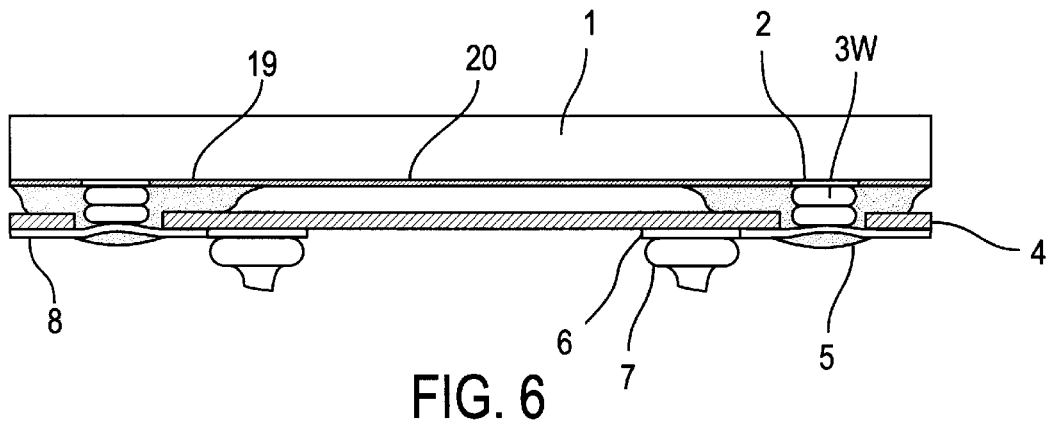
FIG. 6 is a sectional view showing a third embodiment of a semiconductor device of the present invention.

As shown in FIG. 6, metal projection bumps 3W each of which is composed of two piled-up pieces made of gold, Au/Pd, and copper and the like, are formed on the corresponding electrodes 2 of a semiconductor chip 1. Opening portions 5 are formed in the flexible substrate 4 at the positions corresponding to the metal projection bumps 3W. The metal projection bumps 3W are set in the corresponding opening portions 5 whereby the positioning of the semiconductor chip 1 with respect to the flexible substrate 4 is performed.

As described above, by using the metal projecting protrusions 3W composed of the two piled-up pieces, the space between the semiconductor chip 1 and the flexible substrate 4 can be widened. Even when a thick flexible substrate 4 is used, the metal projection bump 3W and the conductive lead 8 on the opening portion 5 can be bonded to one another securely. Furthermore, since the space between the semiconductor chip 1 and the flexible substrate 4 can be set wider, the tolerance for the deformation of the flexible substrate 4 increases whereby the stress applied to the semiconductor chip 1 at the time of mounting is relaxed more effectively. Moreover, when resin is poured into the space to seal the electrode surface of the semiconductor chip 1, the efficiency of pouring the resin increases.

The electrode surface of the semiconductor chip 1 is covered with the coating 20 made of, for example, polyimide (PI) in order to protect the electrode surface of the semiconductor chip 1 from air and moisture. In this embodiment, resin sealer 19 is poured from the opening 5 formed in the flexible substrate 4, and the electrode 2 of the semiconductor 1 and the portion of the metal projection bump 3 protruding into the opening portion 5 are sealed. With this seal, the junction portion between the metal projection bump 3 and the conductive lead 8 can be reinforced; and, in addition, the oxidation and corrosion of this junction portion can be prevented.

In this embodiment, the electrode 2 of the semiconductor 1 used for the positioning and the metal projection bump 3W formed on the electrode 2 serves as an electrode which is actually used for signal a line or power source line. Therefore, it is necessary for the metal projection bump 3 to be in contact with the conductive lead 8 at the opening portion 5. FIG. 6 shows an example of the configuration structure in which the electrodes 2 are arranged in the peripheral portion of the semiconductor chip 1 and the external connection electrodes 6 on the flexible substrate 4 are arranged at the inner positions instead of in the peripheral portion where the electrodes 2 are arranged, in one row or in a plurality of rows.

(Embodiment IV)

An embodiment IV of the present invention will be described with reference to FIG. 7.

Figure 7:
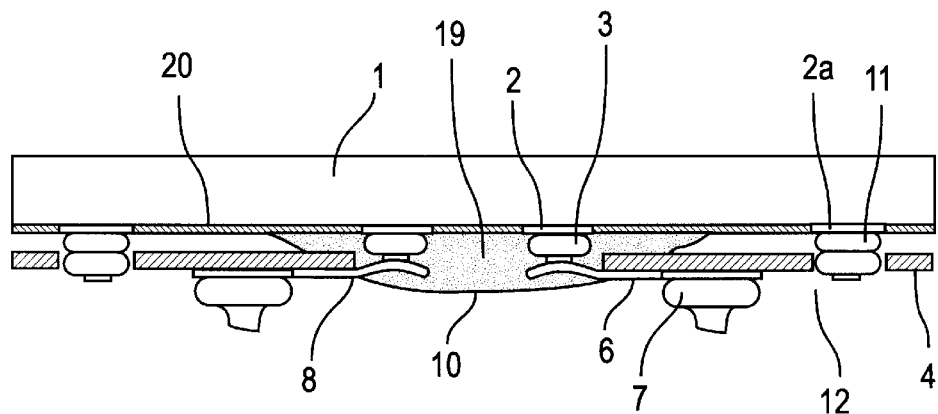
FIG. 7 is a sectional view showing a fourth embodiment of a semiconductor device of the present invention.

As shown in FIG. 7, electrodes 2a are arranged in, for example, four corners of the semiconductor chip 1, and metal projection bumps 11 exclusively used for positioning are formed on these electrodes 2a. Metal projection bump 11 exclusively used for positioning are constituted by piling-up one metal projection bump on another metal projection bump which is the same as the metal projection bumps 3. As described above, the reason why the metal projection bumps 11 exclusively used for positioning have a structure in which one metal projection bump is piled-up on another metal projection bump, the shape of the protrusions being the same as that of the metal projection bumps 3 is that the same protrusion bonder can be used as that used at the time of the formation of the metal projection bump 3 on the electrodes 2 of the semiconductor chip 1.

The opening portions 12 exclusively used for positioning are formed at the portions of the flexible substrate 4 corresponding to the metal projection bumps 11 exclusively used for positioning. The metal projection bumps 11 are set in the corresponding opening portions 12 whereby the positioning of the semiconductor chip 1 with respect to the flexible substrate 4 for bonding can be performed with a high precision.

After the positioning of the semiconductor chip 1 with respect to the flexible substrate 4, the tip portions of the metal projection bumps 11 are crushed with the edge bonder whereby the metal projection bumps 11 are expanded in the radius direction in order to be attached to the opening portions 12 securely. Thus, the semiconductor chip 1 and the flexible substrate 4 are fixed to each other so that the floating of the flexible substrate 4 at resin sealing can be prevented. If the shape of the opening portions 12 exclusively used for the positioning is circular, the precision of positioning is enhanced.

To prevent the electrode surface of the semiconductor chip 1 from being exposed to air and moisture, a coating 20 made of, for example, polyimide, is formed on the semiconductor chip 1.

A central opening portion 10 is formed in the central portion of the flexible substrate 4. A plurality of conductive leads 8 project into the central opening portion 10. The tip portions of the conductive leads 8 are positioned at the corresponding metal projection bumps 3 of the semiconductor chip 1, and the conductive lead 8 and the metal projection bumps 3 are bonded to each other at the central opening portion 10. Then, sealing resin 19 is poured through the central opening portion 10 so that the junction portions between the conductive leads 8 and the metal projection bumps 3 are sealed. With this sealing, in addition to it providing the reinforcement of the junction portions, oxidation and corrosion of the junction portions can be prevented.

(Embodiment V)

Figure 8:
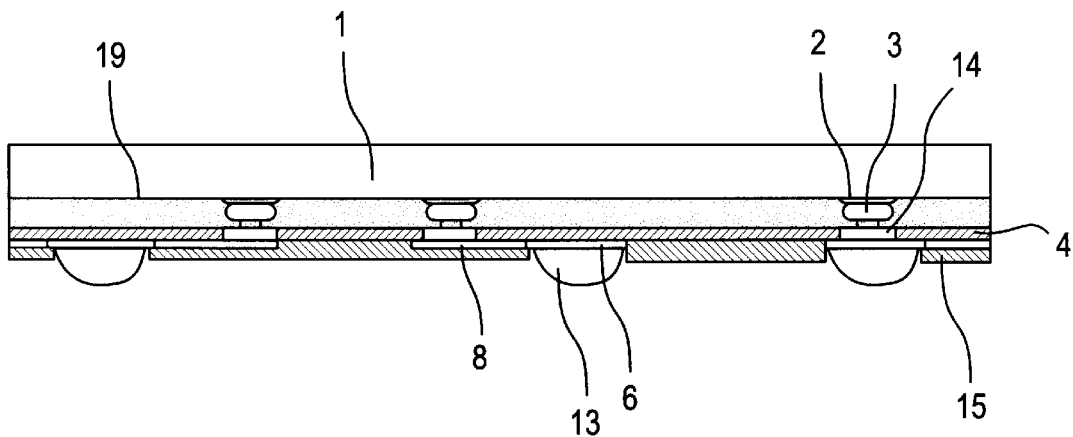
FIG. 8 is a sectional view showing a fifth embodiment of a semiconductor device of the present invention.

An embodiment V of the present invention will be described with reference to FIG. 8.

A plurality of through-holes 14 are formed in the flexible substrate 4 at the positions corresponding to the electrodes 2 of the semiconductor chip 1. The through-holes 14 are buried with the conductive material made of copper and the like by plating. Thus, pads connected to the metal projection bumps 3 are formed. By setting the thickness of the plating at, for example, about 50um with precipitation such that the plating projects slightly from the surface of the flexible substrate 4 in the direction of the semiconductor chip 1, the metal projection bumps 3 of the semiconductor chip 1 can be omitted.

Sealing resin 19 such as epoxy or silicone series is poured through the space between the semiconductor chip 1 and the flexible substrate 4 whereby the semiconductor chip 1 is fixed to the flexible substrate 4 and the electrode surface of the semiconductor chip 1 is sealed. Furthermore, in this embodiment, the three-layer structure is adopted wherein the solder resist 15 made of, for example, polyimide, is formed on the portions except for the external connection electrodes 6 on the conductive leads 8 of the flexible substrate 4. The soldering protrusion bumps 13 are formed on the external connection electrodes 6.

(Embodiment VI)

An embodiment VI of the present invention will be described with reference to FIG. 9.

Figure 9:
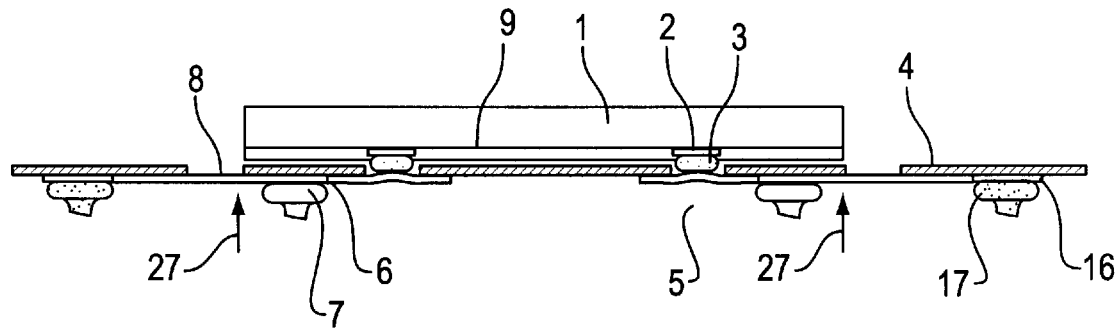
FIG. 9 is a sectional view showing a sixth embodiment of a semiconductor device of the present invention.

As shown in FIG. 9, on the flexible substrate 4, a group of external connection electrodes 16 is formed in the region other than that corresponding to the semiconductor chip 1 besides the other group of the external connection electrodes 6 formed in the region corresponding to the semiconductor chip 1. Each electrode of the group of electrodes 16 is connected to one of the electrodes 6 of the other group in pairs through the conductive lead 8 formed on the flexible substrate 4. Furthermore, the conductive leads 8 are connected to the semiconductor chip 1 through the metal projection bumps 3 formed on the electrodes 2 of the semiconductor chip 1.

The metal projection bump 17 made of gold, Au/Pd, and copper and the like is formed on each of the external connection electrodes 16 extending outward from the region in the semiconductor chip 1. Hence, a test such as ET (Electrical Test)/BT (Burn in Test) can be conducted using a special jig. After the test is performed, the flexible substrate 4 (including the conductive lead 8) is cut at the position on the line along the outer circumference of the semiconductor chip 1 shown by the arrow line 27 whereby the portion of the flexible substrate 4 other than that corresponding to the semiconductor chip 1 is cut off. Thus, the external shape of the semiconductor device of this embodiment can be made the same as that of the semiconductor chip 1, thereby reducing the mounting area of the semiconductor device.

As described above, the formation of the external connection electrodes 16 for testing in the region of the flexible substrate 4 outside the region corresponding to the semiconductor chip 1 can be applied in the above described embodiments I to V. Specifically, the semiconductor devices of the embodiments I to V can be manufactured based on a semiconductor device similar to the one of this embodiment.

Figure 11:
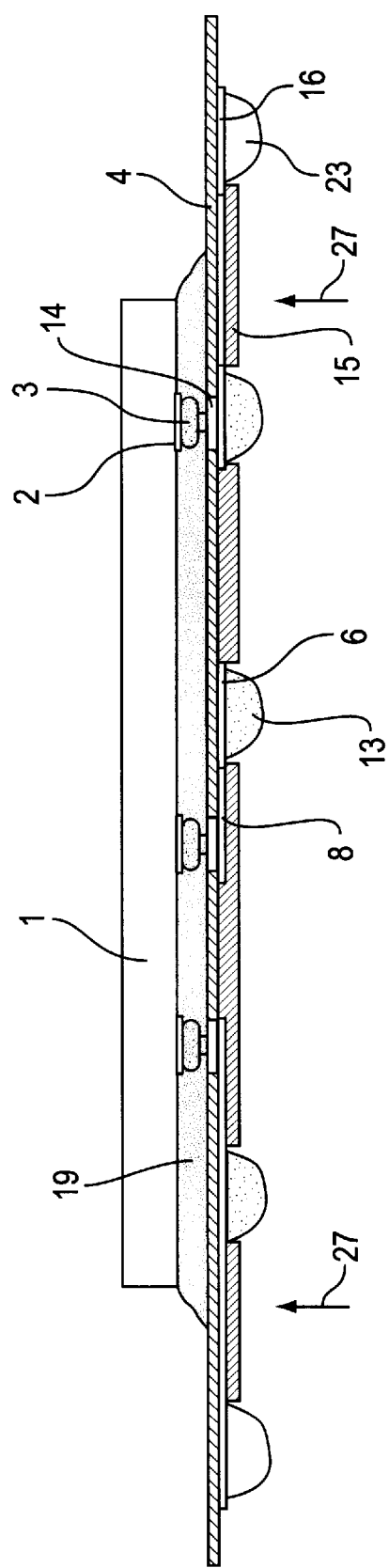
FIG. 11 is a sectional view showing an application of the fifth embodiment of a semiconductor device of the present invention.

FIG. 11 shows an example of the structure in which the external connection electrodes 16 for testing are applied in the embodiment V. As shown in FIG. 11, the flexible substrate 4 has a larger shape than that of the semiconductor chip 1. On the flexible substrate 4, the external connection electrodes 16 for testing are formed in the region other than that corresponding to the semiconductor chip 1. Each of the external connection electrodes 16 for testing is connected to one of the external connection electrodes 6 in pairs through the conductive lead 8 formed on the flexible substrate 4.

Soldering protrusion bumps 23 are formed on the external connection electrodes 16 for testing. The electrodes 2, the metal projection bumps 3, the through-holes 14, the solder resist 15, the sealing resin 19 and the soldering protrusion bumps 13 have similar structures to those shown in FIG. 8.

After the test is performed, the flexible substrate 4 (including the conductive leads 8, the solder resist 15 and the sealing resin 19) is cut at the position on the line along the outer circumference of the semiconductor chip 1 shown by the arrow 27.

(Embodiments VII, VIII)

Figure 10:
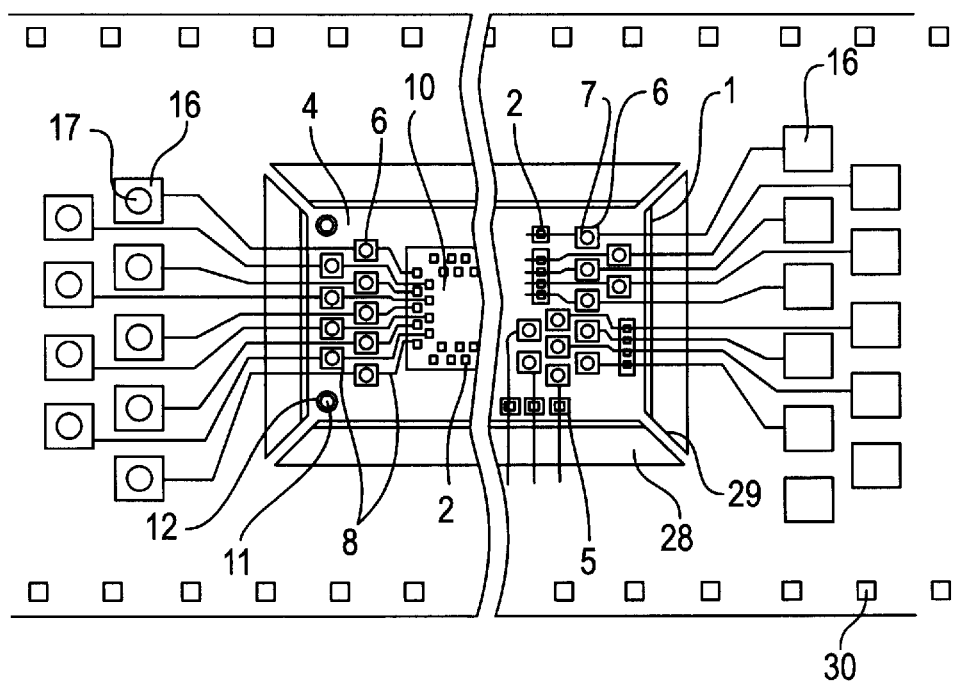
FIG. 10 is a plan view showing a seventh and an eighth embodiment of a semiconductor device of the present invention.

The electrodes 2, 2a, 6, and 16, the metal projection bumps 3, 7, 11, and 17, the opening portions 5 and 10, and the through-holes 14 are arranged in various combinations against the semiconductor chip 1. FIG. 10 is a plan view of the embodiment of the present invention in which the above mentioned components are arranged properly in the various combinations. In FIG. 10, the half of the drawing on the right side shows the embodiment VII and the half of the drawing on the left side shows the embodiment VIII.

In the semiconductor devices of the embodiments VII and VIII, the semiconductor chip 1 is attached to the tape-shaped flexible substrate 4 having a plurality of sprocket holes 30 on both sides thereof. Separation holes 28 are formed in the flexible substrate 4 leaving the supporting portion 29. The semiconductor device of the embodiment VI shown in FIG. 9 is a state in which the semiconductor chip 1 is attached to the tape-shaped flexible substrate 4 in such manner. The semiconductor device of the embodiments I to V shown in FIGS. 3 to 8 can be obtained by cutting the supporting portion 29 in the state shown in FIG. 10 and by further cutting the portion of the conductive lead 8 at the separation hole 28 to separate the outer portion of the semiconductor chip 1.

The semiconductor chip 1, the electrode 2, the flexible substrate 4, the opening portion 5, the external connection electrode 6, the metal projection bump 7, the conductive lead 8, the central opening portion 10, the metal projection bump 11 exclusively used for positioning, the opening portion 12 exclusively used for positioning, the external connection electrode 16, and the metal projection bump 17 have similar structures to those shown in FIGS. 3 to 9. Furthermore, in the embodiments VII and VIII shown in FIG. 10, the metal projection bump 3 similar to that in FIGS. 3 to 9 is formed although it is not shown in FIG. 10.

The right portion of FIG. 10 shows an example where the electrode 2a exclusively used for positioning and the metal projection bump 11 exclusively used for positioning are not used. Principally by setting the metal projection bump 3 into the opening portion 5 of the flexible substrate 4, the positioning of the flexible substrate 4 with respective to the semiconductor substrate 1 is completed. The external connection electrode 6 on the flexible substrate 4 is arranged inside the region in which the semiconductor chip 1 is mounted, and the external connected electrode 16 used for the test is arranged outside the region in which the semiconductor chip 1 is mounted, i.e., outside the separation hole 28.

In the example shown in the left portion of FIG. 10, the positioning of the flexible substrate 4 with respect to the semiconductor chip 1 is done by using the metal projection bumps 11 exclusively used for positioning and the opening portions 12 exclusively used for positioning of the flexible substrate 4, the metal projection bumps 11 being formed in four corners of the semiconductor chip 1, respectively. In this example, the electrodes 2 are arranged in high concentration at the positions corresponding to the inside of the central opening portion 10 formed in the flexible substrate 4. Furthermore, the external connection electrodes 6 of the flexible substrate 4 are arranged at the positions disposed more externally than those of the electrodes 2 and the semiconductor chip 1 is mounted thereon. The external connection electrodes 16 are arranged in the region-outside the region where the semiconductor chip 1 is mounted.

As described above, according to the semiconductor device of the present invention, the semiconductor chip and the flexible substrate are connected to each other with the first bump, and the second bump formed in the flexible substrate connected to the mounting substrate. Thus, the semiconductor chip is not affected by warp and winding of the mounting substrate and by the thermal expansion of the mounting substrate. Particularly, since a space having a sufficient width can be formed between the semiconductor chip and the flexible substrate by means of the first bump, it is not necessary to fill up the space between the semiconductor chip and the flexible substrate with an elastic adhesive agent to separate the semiconductor chip from the flexible substrate.

Furthermore, since the connecting of the mounting substrate to the flexible substrate is done by means of the second bump and the lead and the like do not extend to the outside of the flexible substrate, the dimension of the flexible substrate can be as large as those of the semiconductor chip so that a mounting area can be reduced. Moreover, the first bump is set in the opening portion and the positioning bump is set in the positioning opening portion whereby the positioning of the semiconductor chip with respect to the flexible substrate can be done easily and precisely.

Furthermore, the flexible substrate is designed such that it can be cut off along the outer circumference of the semiconductor chip and the electrode for the testing of the flexible substrate is arranged in the region outside the positions at which the semiconductor chip is mounted whereby tests such as ET/BT can be performed in a state in which the semiconductor chip is connected to the flexible substrate. After the tests are performed, the flexible substrate is cut off along the outer circumference of the semiconductor chip whereby the semiconductor device having approximately the same external shape as that of the semiconductor chip can be obtained, which has already been subjected to the tests.

What is claimed is:

1. A semiconductor device including a carrier and a semiconductor chip, said carrier comprising:
   a flexible substrate having a same planar size as said semiconductor chip, said flexible substrate having an opening portion at a position corresponding to an electrode on said semiconductor chip;
   a conductive lead disposed at said opening portion; and
   a first bump for an external connection formed on said flexible substrate and connected to said conductive lead; and
   said semiconductor chip comprising:
      a second bump formed on the electrode of said semiconductor chip and connected to said conductive lead.

2. A semiconductor device including a carrier and a semiconductor chip, said carrier comprising:
   a flexible substrate having at least a same planar size as said semiconductor chip, said flexible substrate having an opening portion at a position corresponding to an electrode on said semiconductor chip;
   a conductive lead disposed at said opening portion; and
   a first bump for an external connection formed on said flexible substrate and connected to said conductive lead; and
   said semiconductor chip comprising:
      a second bump formed on the electrode of said semiconductor chip and connected to said conductive lead,
      wherein said conductive lead is formed on a surface of said flexible substrate opposite to said semiconductor chip, and said second bump on said semiconductor chip is said opening portion of said flexible substrate.

3. The semiconductor device according to claim 2, wherein said second bump on said semiconductor chip is composed of a plurality of metal protrusions piled up.

4. The semiconductor device according to claim 2, wherein said second bump on said semiconductor chip and said opening portion are sealed with resin.

5. The semiconductor device according to claim 1, wherein a positioning bump composed of a plurality of metal protrusions piled up is formed on said semiconductor chip, and said positioning bump is disposed in a positioning opening portion formed the flexible substrate to align the substrate and the semiconductor chip.

6. A semiconductor device including a carrier and a semiconductor chip, said carrier comprising:
   a flexible substrate having a same planar size as said semiconductor chip, said flexible substrate having an opening through-hole at a position corresponding to an electrode on said semiconductor chip;
   a conductive pad disposed in said through-hole;
   a conductive lead connected to said conductive pad; and
   a first bump for an external connection formed on said flexible substrate and connected to said conductive lead; and
   said semiconductor chip comprising:
      a second bump formed on the electrode on said semiconductor chip, and connected to said pad.

7. The semiconductor device according to claim 6, wherein said carrier and said semiconductor chip are spaced from each other and a space between said flexible substrate and said semiconductor chip is sealed with resin.

8. A semiconductor device including a carrier and a semiconductor chip, said carrier comprising:
   a trimmable flexible substrate having an initial planar size larger than said semiconductor chip, said flexible substrate having an opening portion at a position corresponding to an electrode on said semiconductor chip;
   a conductive lead disposed at said opening portion;
   a first bump being accessible for connection with an external circuit and formed in a region of said flexible substrate where said semiconductor chip is mounted and connected to said conductive lead;
   an electrode for testing formed in a region of said flexible substrate where the semiconductor chip is not mounted, said electrode being connected to said conductive lead,
   wherein said flexible substrate is trimmable together with said conductive lead around an external perimeter of said semiconductor chip to detach said testing electrode and to produce a semiconductor device which is operable with said external circuit; and
   said semiconductor chip comprising a second bump formed on the electrode on said semiconductor chip and connected to said conductive lead.

9. A semiconductor device including a carrier and a semiconductor chip, said carrier comprising:
- a trimmable flexible substrate, said flexible substrate having an opening portion at a position corresponding to an electrode on said semiconductor chip;
- a conductive lead disposed at said opening portion;
- a first bump for external connection and formed in a region of said flexible substrate where said semiconductor chip is mounted and connected to said conductive lead;
- an electrode for testing formed in a region of said flexible substrate where the semiconductor chip is not mounted, said electrode being connected to said conductive lead,
- wherein said flexible substrate is trimmable together with said conductive lead to detach said testing electrode and to produce a semiconductor device which is operable with a circuit; and
- said semiconductor chip comprising a second bump formed on the electrode on said semiconductor chip and connected to said conductive lead
- wherein said conductive lead is formed on a surface of said flexible substrate opposite to said semiconductor chip, and said second bump on the semiconductor chip is disposed in said opening portion of said flexible substrate.

10. A semiconductor device including a carrier and a semiconductor chip, said carrier comprising:
- a trimmable flexible substrate having an initial planar size that is larger than said semiconductor chip, said flexible substrate having a through-hole at a position corresponding to an electrode on said semiconductor chip;
- a conductive pad disposed in said through-hole;
- a conductive lead connected to said conductive pad;
- a first bump being accessible for connection with an external circuit and formed in a region of said flexible substrate on which said semiconductor chip is mounted and connected to said conductive lead; and
- an electrode for testing formed in a region of said flexible substrate where the semiconductor chip is not mounted, said electrode being connected to said conductive lead,
- wherein said flexible substrate is trimmable together with said conductive lead around an external perimeter of said semiconductor chip to detach said testing electrode and to produce a semiconductor device which is operable with said external circuit; and
- said semiconductor chip comprising:
  - a second bump formed on an electrode of said semiconductor chip and connected to said pad.

11. A semiconductor device including a carrier and a semiconductor chip, said carrier comprising:
- a flexible substrate having a smaller planar size than said semiconductor chip, said flexible substrate having an opening portion at a position corresponding to an electrode on said semiconductor chip;
- a conductive lead disposed at said opening portion; and
- a first bump for an external connection formed on said flexible substrate and connected to said conductive lead; and
- said semiconductor chip comprising a second bump formed on the electrode of said semiconductor chip and connected to said conductive lead.

12. The semiconductor device according to claim 11, wherein said conductive lead is formed on a surface of said flexible substrate opposite to said semiconductor chip, and said second bump on said semiconductor chip is disposed in said opening portion of said flexible substrate.

* * * * *